United States Patent
Tsao

(10) Patent No.: US 9,730,370 B2
(45) Date of Patent: Aug. 8, 2017

(54) CASING, ELECTRONIC DEVICE EMPLOYING SAME AND MANUFACTURING METHOD

(71) Applicant: FIH (HONG KONG) LIMITED, Kowloon (HK)

(72) Inventor: Chia-Wen Tsao, New Taipei (TW)

(73) Assignee: FIH (HONG KONG) LIMITED, Kowloon (HK)

( * ) Notice: Subject to any disclaimer, the term of this patent is extended or adjusted under 35 U.S.C. 154(b) by 42 days.

(21) Appl. No.: 14/826,420

(22) Filed: Aug. 14, 2015

(65) Prior Publication Data

US 2016/0192517 A1 Jun. 30, 2016

(30) Foreign Application Priority Data

Dec. 24, 2014 (CN) .......................... 2014 1 0812398

(51) Int. Cl.
| | |
|---|---|
| *H05K 13/00* | (2006.01) |
| *H04M 1/02* | (2006.01) |
| *H04B 1/3888* | (2015.01) |
| *H01Q 1/24* | (2006.01) |

(52) U.S. Cl.
CPC .......... *H05K 13/00* (2013.01); *H04B 1/3888* (2013.01); *H04M 1/0202* (2013.01); *H01Q 1/243* (2013.01); *H04M 1/026* (2013.01); *H04M 1/0283* (2013.01)

(58) Field of Classification Search
CPC .... H05K 13/00; H04M 1/243; H04M 1/0202; H04M 1/026; H04M 1/0283; H04B 1/3888; H01Q 1/243
See application file for complete search history.

(56) References Cited

U.S. PATENT DOCUMENTS

| 9,479,211 | B2* | 10/2016 | Liu | ...................... | H04B 1/3888 |
|---|---|---|---|---|---|
| 2007/0241971 | A1* | 10/2007 | Tsujimura | ............. | G06F 1/1616 |
| | | | | | 343/702 |
| 2010/0055419 | A1* | 3/2010 | Wu | ........................ | B44C 1/228 |
| | | | | | 428/206 |
| 2014/0126172 | A1* | 5/2014 | Fahlgren | ................ | H01Q 1/243 |
| | | | | | 361/814 |
| 2014/0247188 | A1* | 9/2014 | Nakano | .................. | H01Q 1/243 |
| | | | | | 343/702 |
| 2015/0050968 | A1* | 2/2015 | Jeon | ......................... | C25D 5/48 |
| | | | | | 455/575.1 |
| 2015/0241921 | A1* | 8/2015 | Gu | ...................... | H04M 1/0202 |
| | | | | | 361/679.56 |
| 2015/0249292 | A1* | 9/2015 | Ouyang | ................. | H01Q 21/30 |
| | | | | | 343/702 |

* cited by examiner

*Primary Examiner* — Adrian S Wilson
*Assistant Examiner* — Abhishek Rathod
(74) *Attorney, Agent, or Firm* — Steven Reiss

(57) ABSTRACT

A casing includes a cover and a frame coupled to the cover. The frame includes a base body and a plurality of non-conductive portions. The base body defines a plurality of gaps spaced from each other. The non-conductive portions are correspondingly inserted into the gaps to insulate opposite sides of each gap. A manufacturing method and an electronic device of the casing are also provided.

13 Claims, 11 Drawing Sheets

CASING, ELECTRONIC DEVICE EMPLOYING SAME AND MANUFACTURING METHOD

FIELD

The subject matter herein generally relates to a casing, an electronic device employing the casing, and a manufacturing method of the casing.

BACKGROUND

Some electronic devices may use metal casing, which may generate an electromagnetic shield to an antenna of the electronic devices, thereby a performance of the antenna may be affected.

BRIEF DESCRIPTION OF THE DRAWINGS

Implementations of the present technology will now be described, by way of example only, with reference to the attached figures.

DETAILED DESCRIPTION

Figure 1:
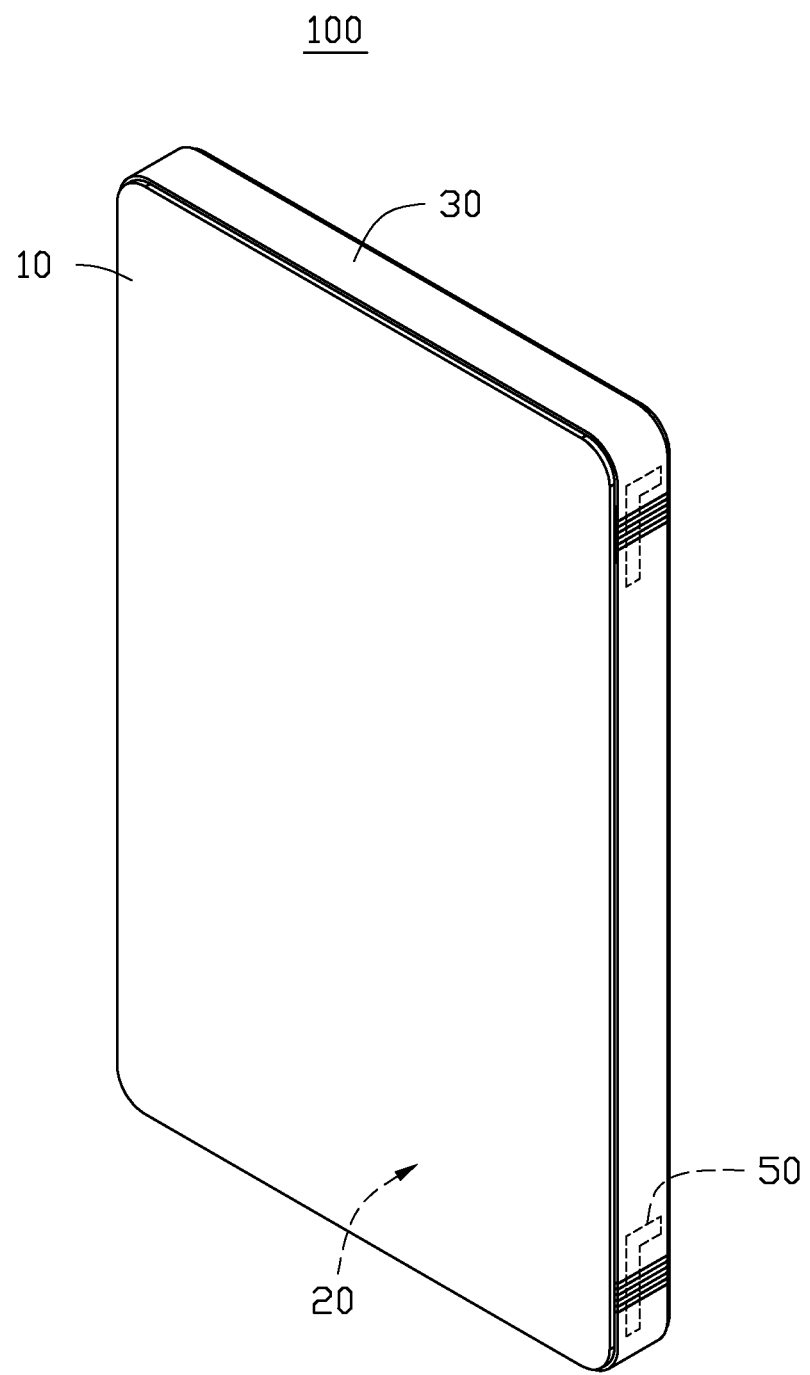
FIG. 1 is an isometric view of a first embodiment of an electronic device including a casing.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

FIG. 1 illustrates at least one embodiment of an electronic device 100, which can be a mobile phone, a tablet computer, or a PDA. The electronic device 100 includes a main body 10, a casing 30, a receiving space 20 enclosed by the main body 10 and the casing 30, and an antenna 50 received in the receiving space 20. The electronic device 100 includes other electronic components, such as a battery, received in the receiving space 20.

Figure 2:
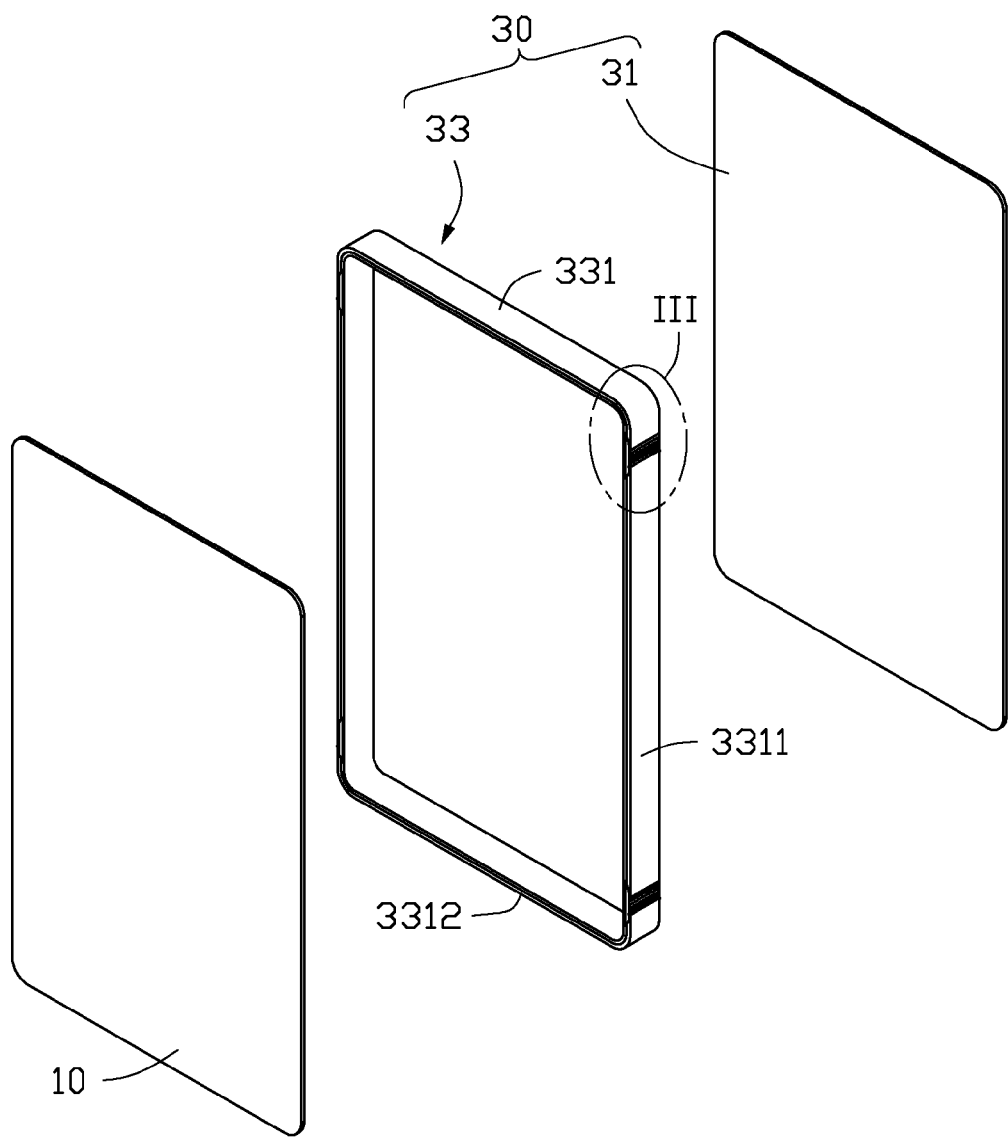
FIG. 2 is an explored view of the electronic device of FIG. 1.
Figure 3:
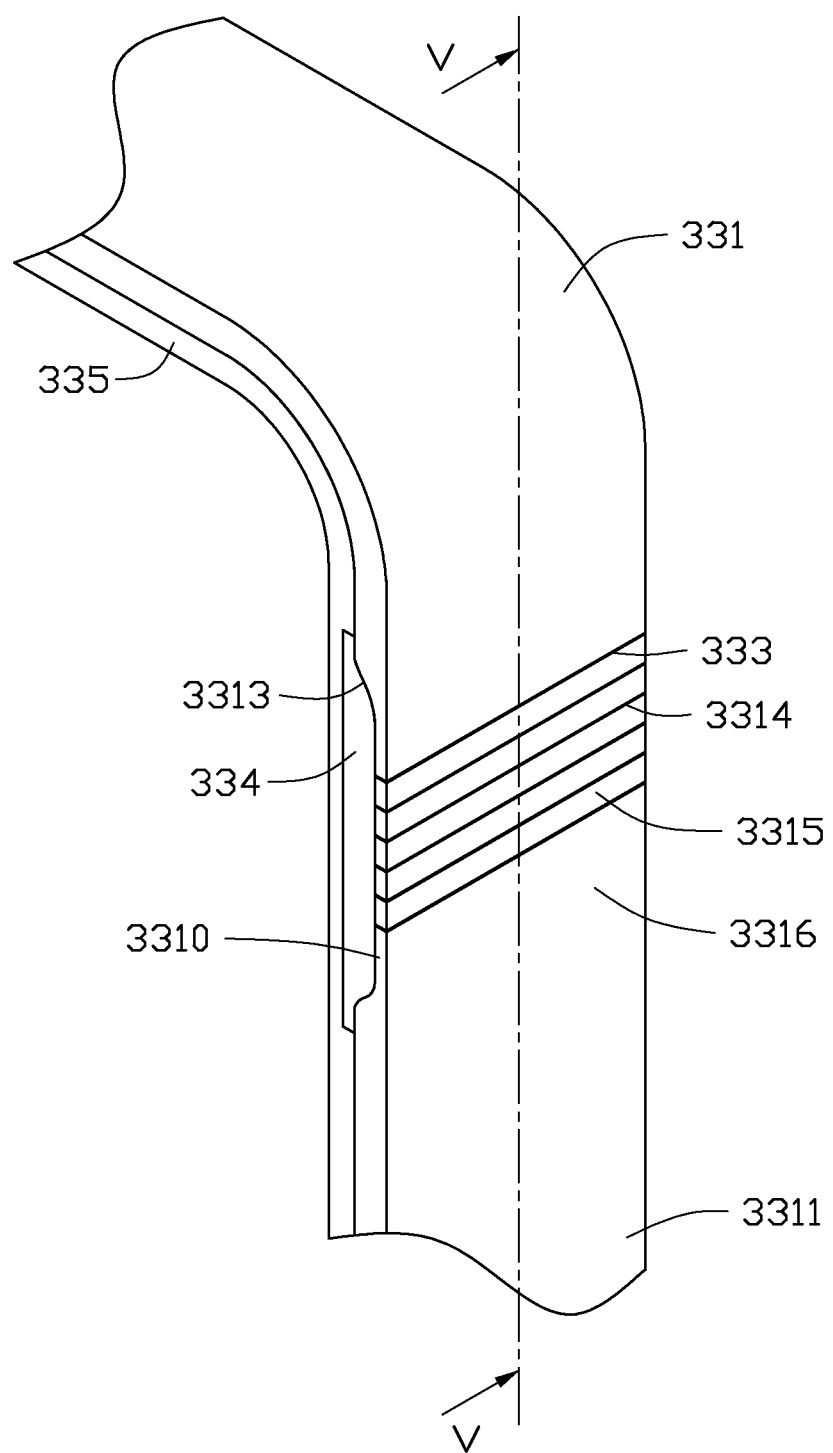
FIG. 3 is an enlarge view of circled portion III of the casing of FIG. 2.
Figure 4:
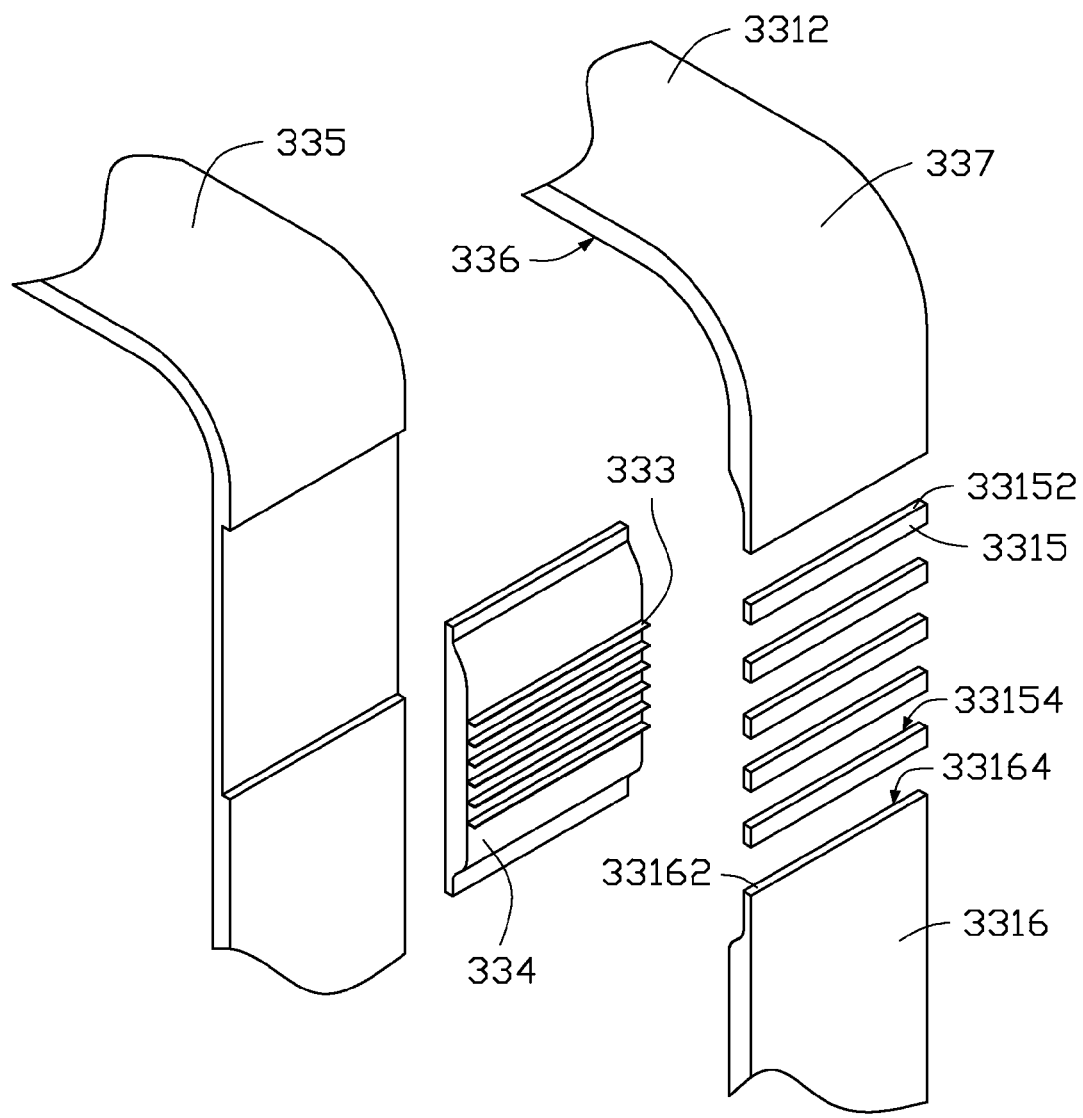
FIG. 4 is an explored view of the casing of FIG. 3.

FIGS. 2, 3, and 4 illustrate that the casing 30 includes a cover 31 and a frame 33 sandwiched between the main body 10 and the cover 31. The frame 33 includes a base body 331, a non-conductive portion 333 implanted in the base body 331, and a connecting layer 335 formed on a surface of the base body 331. The base body 331 includes a first surface 336 facing the receiving space 20 and a second surface 337 opposite to the first surface 336. The first surface 336 defines at least one groove 3313, which forms a thin portion 3310 for the base body 331. A thickness of the thin portion 3310 is about 0.3-0.5 millimeter. The base body 331 further includes two first sidewalls 3311 and two second sidewalls 3312 connected in turn. The two first sidewalls 3311 and the two second sidewalls 3312 are connected in turn to enclose a rectangular frame. In one embodiment, the base body 331 defines four grooves 3313. Each groove 3313 is defined on each end of the first sidewall 3311 adjacent to the second sidewall 3313. Each two grooves 3313 are symmetrically arranged on the two first sidewalls 3311.

Figure 7:
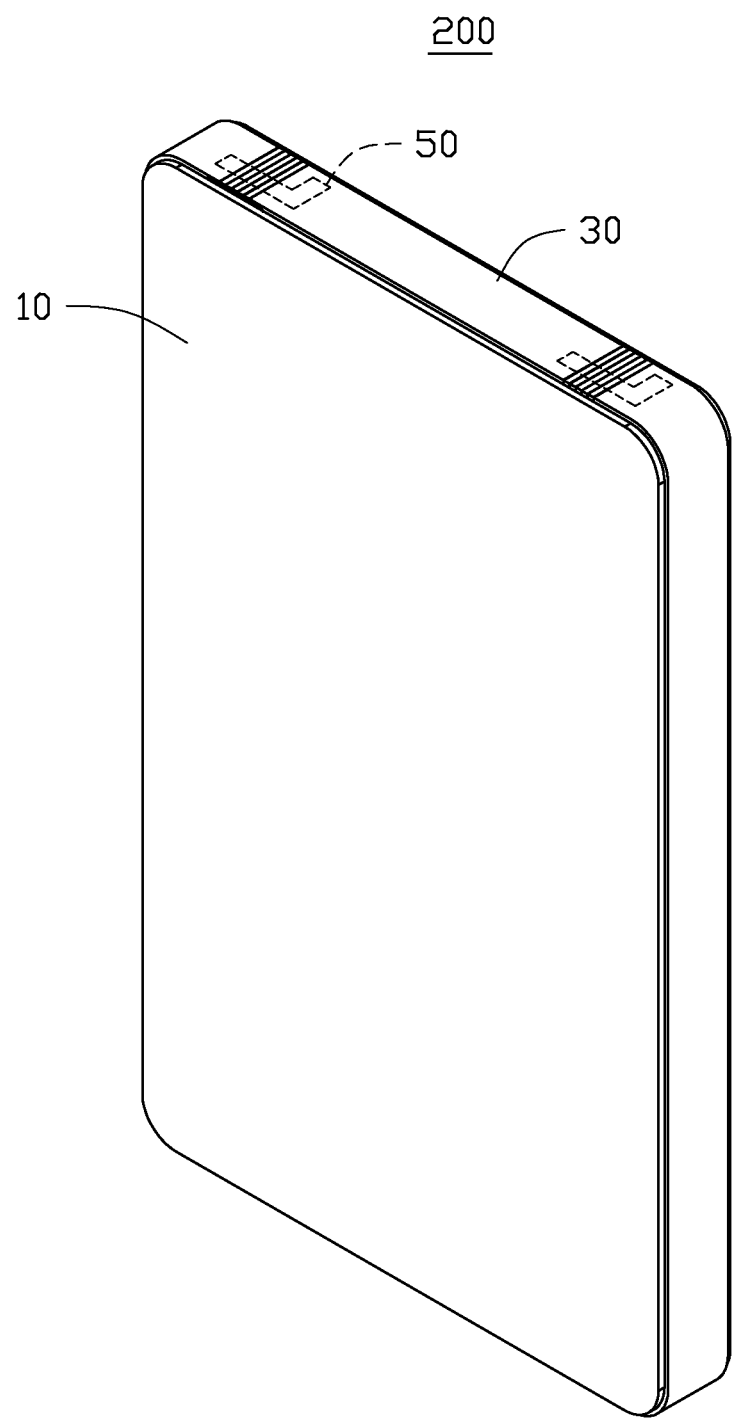
FIG. 7 is an isometric view of a second embodiment of an electronic device including a casing.
Figure 8:
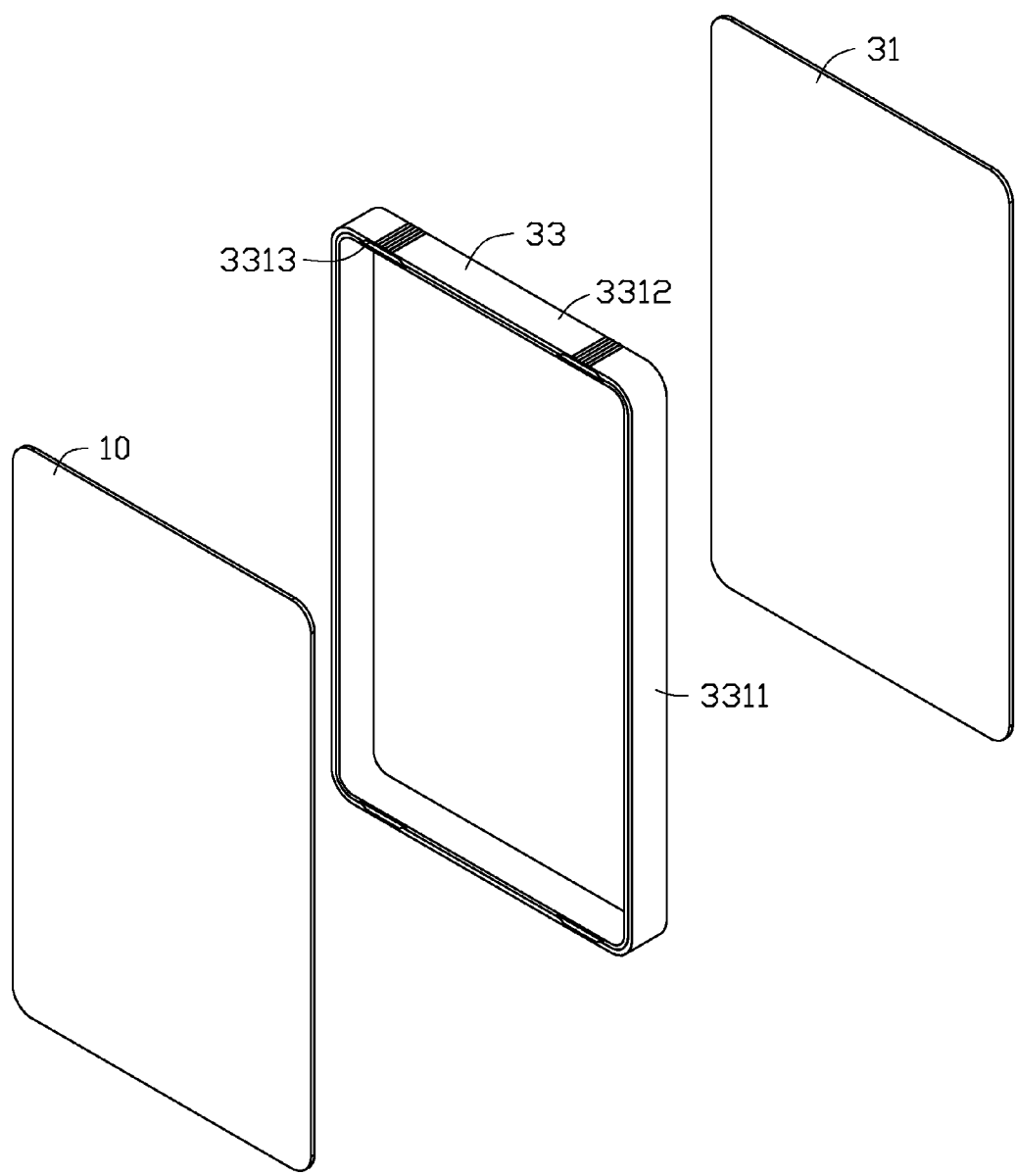
FIG. 8 is an explored view of the electronic device of FIG. 7.

FIGS. 7 and 8 illustrate a second embodiment that the grooves 3313 are defined on opposite ends of the second sidewall 3312 adjacent to the first sidewalls 3311.

Figure 5:
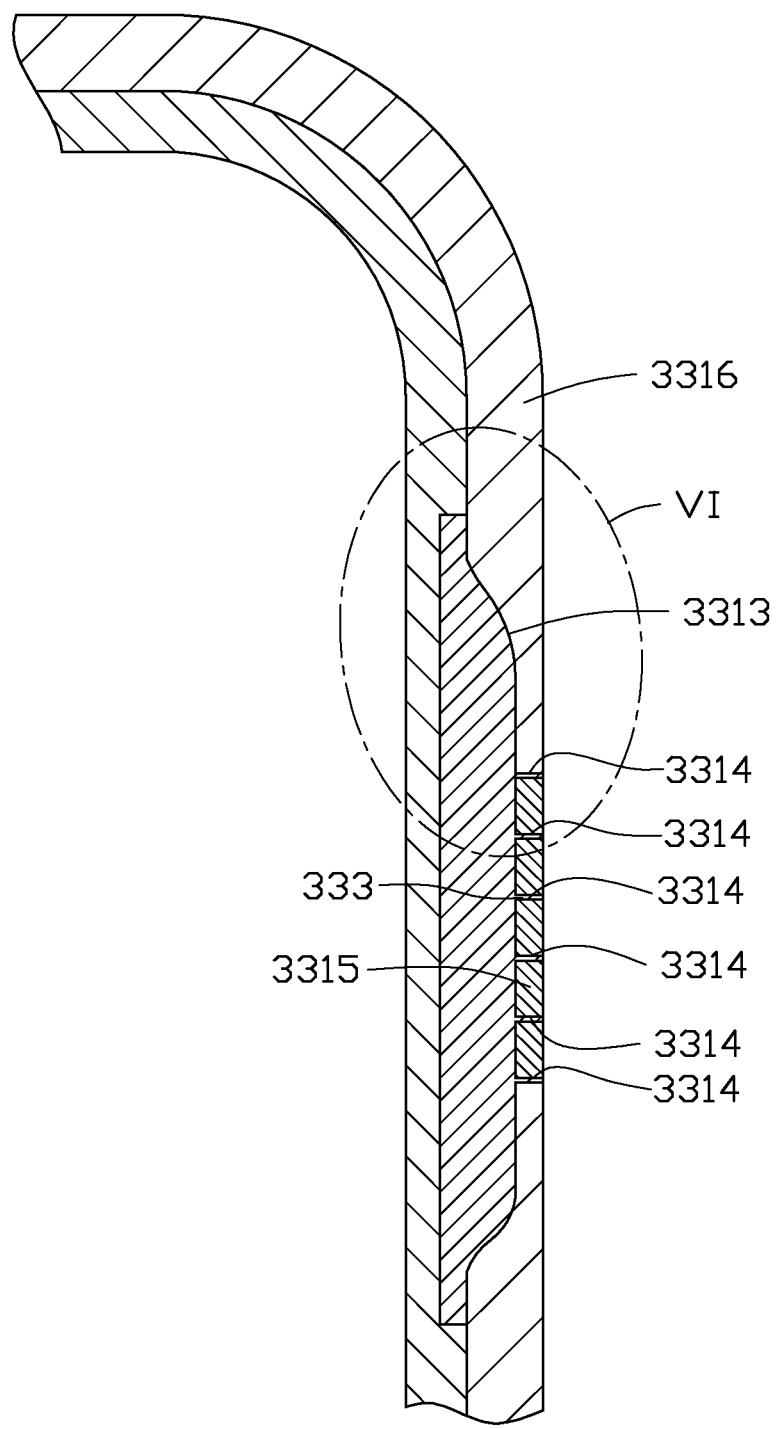
FIG. 5 is a cross-sectional view along line V-V of the casing of FIG. 3.

FIG. 5 illustrates that the thin 3310 defines a group of gaps 3314 adjacently arranged. The gaps 3314 adjacently intersect the thin portion 3310. The gaps 3314 divide the base body 331 into a plurality of metal pieces 3315 and a plurality of base portions 3316. In one embodiment, a width of each gap 3314 is about 0.03-0.15 millimeter. The gaps 3320 are parallel to each other.

Figure 9:
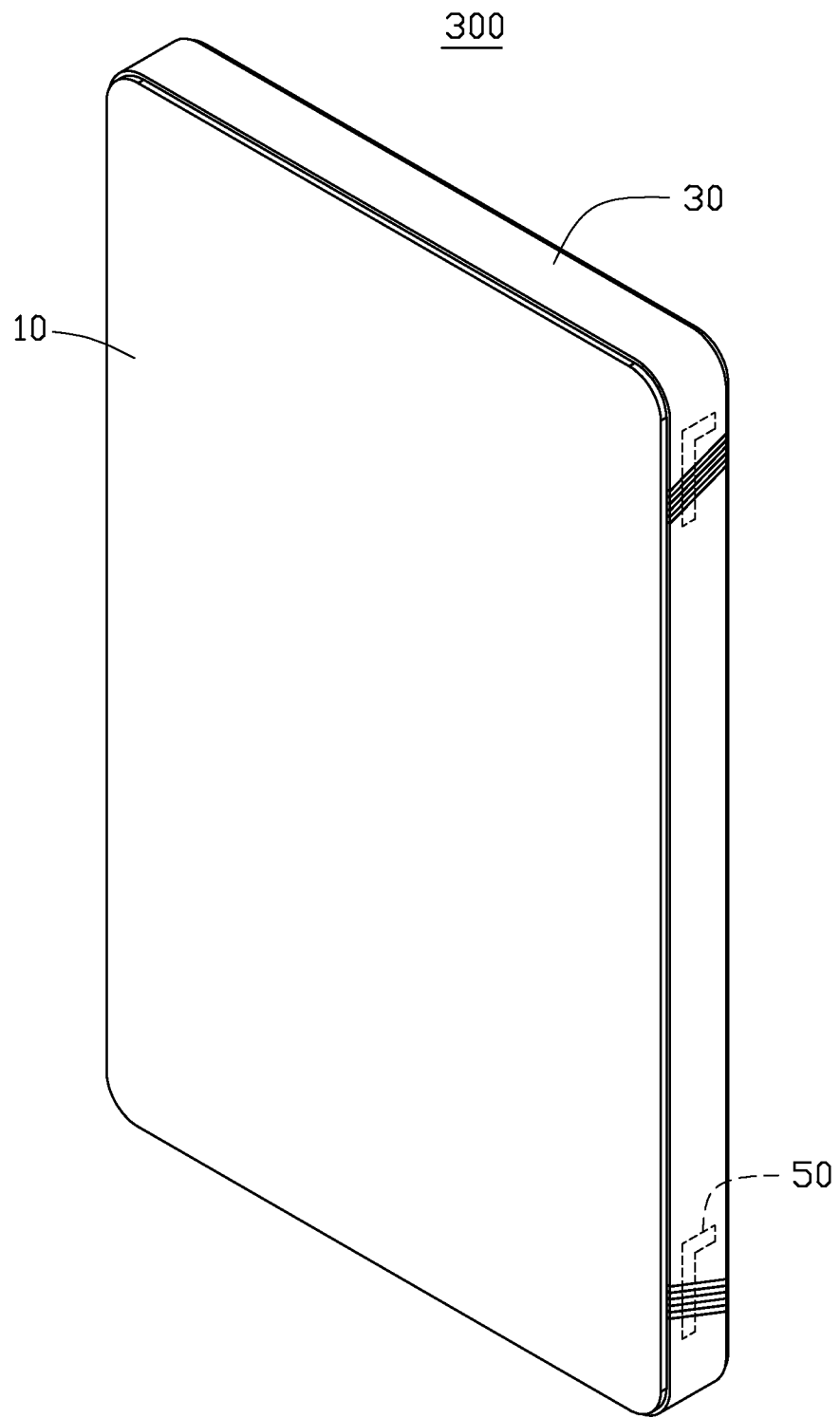
FIG. 9 is an isometric view of a third embodiment of an electronic device including a casing.
Figure 10:
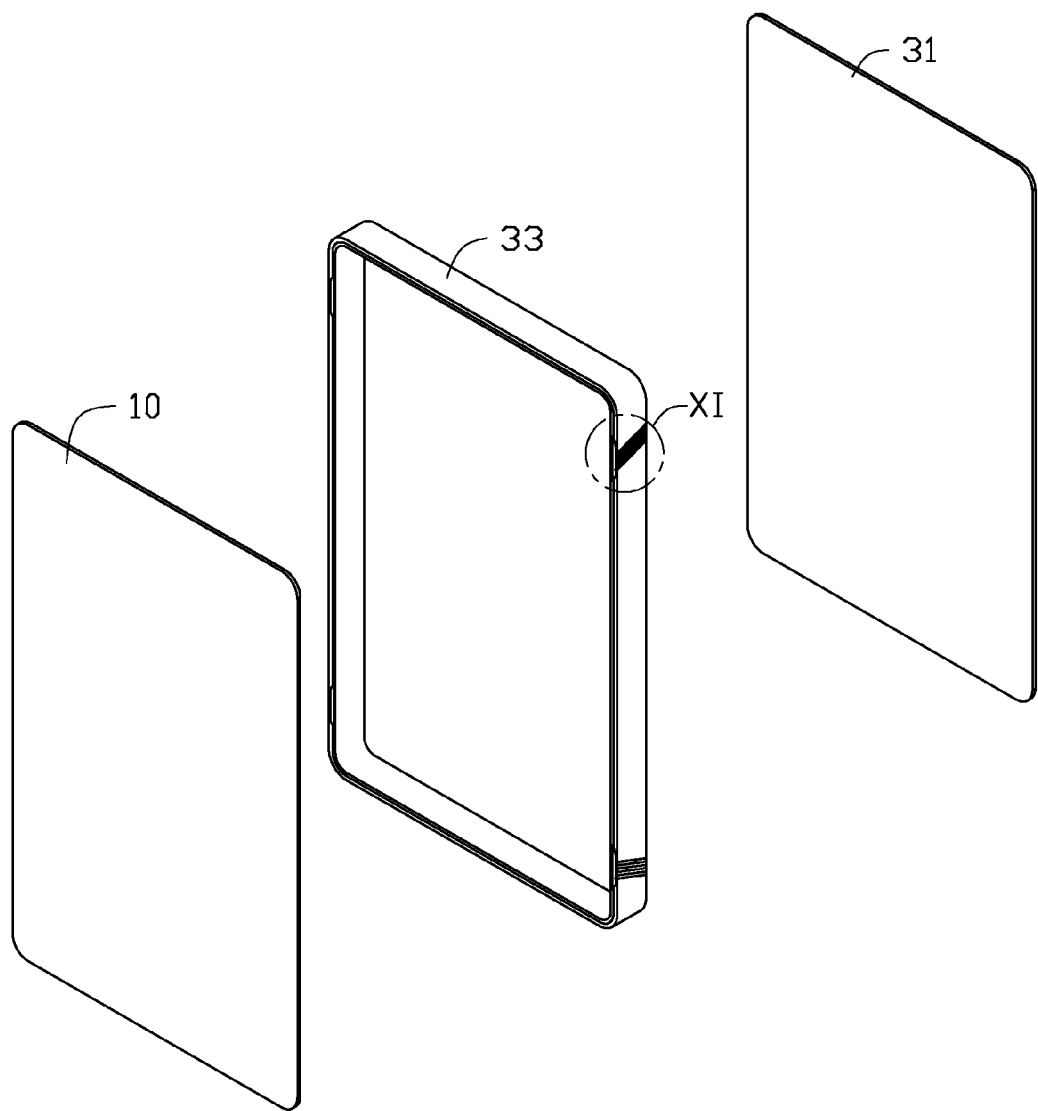
FIG. 10 is an explored view of the electronic device of FIG. 9.
Figure 11:
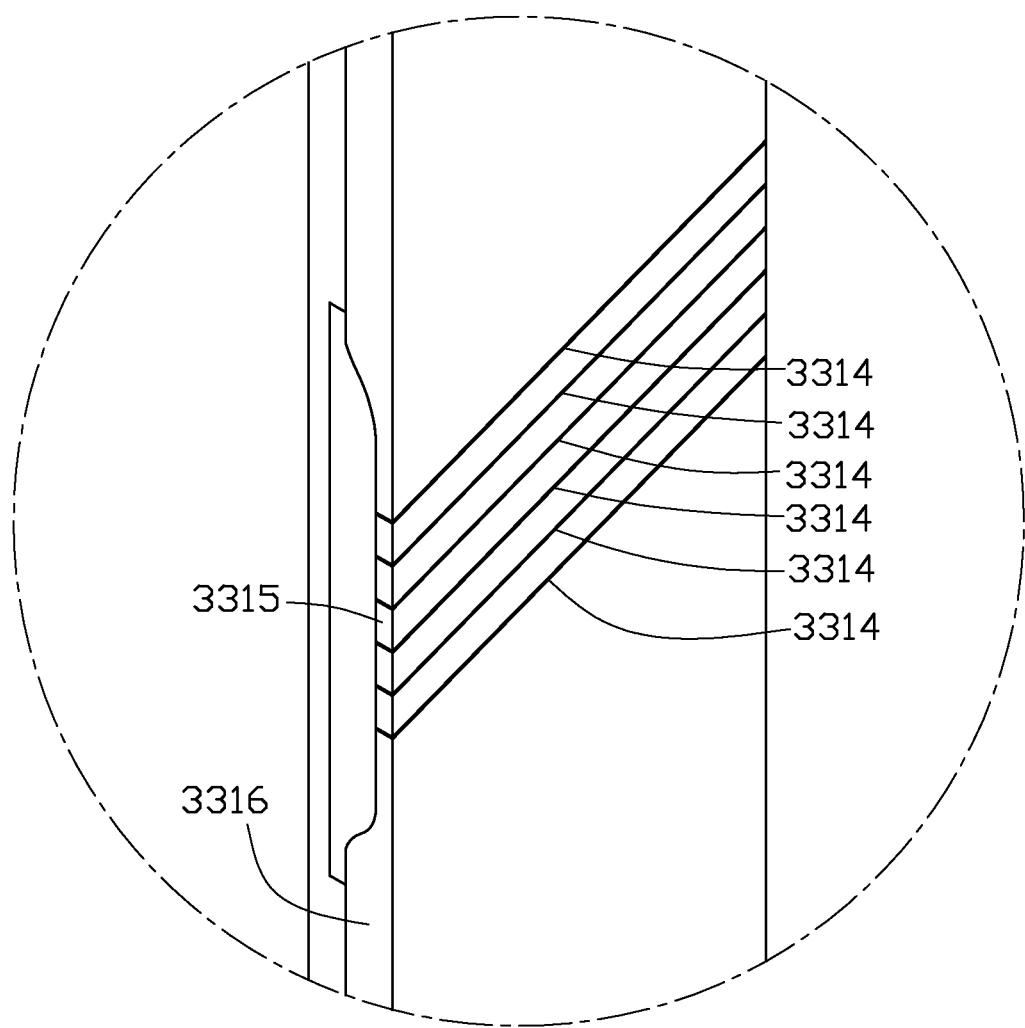
FIG. 11 is an enlarge view of circled portion XI of the electronic device of FIG. 10.

FIGS. 9, 10, and 11 illustrate a third embodiment that the gaps 3314 on a same sidewall are slantwise, the metal pieces 3315 and the base portions 3316 divided by the gaps 3314 are correspondingly slantwise.

Figure 6:
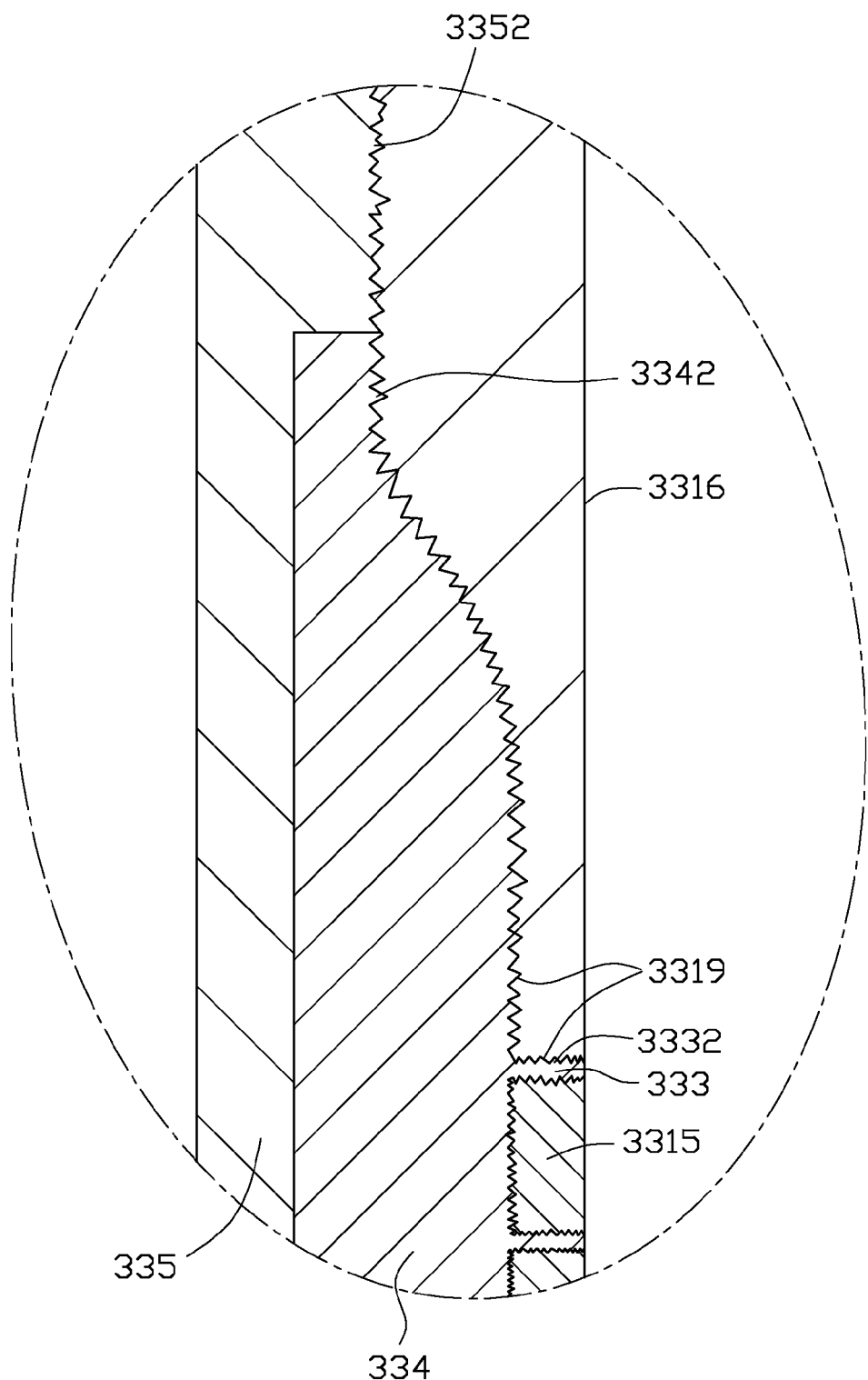
FIG. 6 is an enlarge view of circled portion VI of the casing of FIG. 5.

FIGS. 4, 5, and 6 illustrate that each metal piece 3315 includes two opposite side surface 33152 and an internal surface 33154 adjacent to the two side surface 33152. Each base portion 3316 includes a side surface 33162 and an internal surface 33164 adjacent to the side surface 33162. The side surface 33152, the internal surface 33154, the side surface 33162, and the internal surface 33164 define a plurality of nano holes 3319 with a diameter of about 40-60 nanometer.

The non-conductive portion 333 is inserted and secured in the gaps 3314 for insulating opposite sides of each gap 3314. The non-conductive portion 333 and the metal pieces 3315 are arranged by turns, and the metal piece 3315 and the base portion 3316 is connected via the non-conductive portion 333. The non-conductive portion 333 includes a plurality of ribs 3332 for engaging with the nano holes 3319 of the side surface 33152, 33162 to strengthen the connection of the metal piece 3315 and the base portion 3316. A width of the non-conductive portion 333 is equated to a width of the gap 3314 of about 0.03-0.15 millimeter. The non-conductive portion 333 can be made of non-conductive material, such as plastic, glass, or ceramic, and the plastic can be such as polybutylene terephthalate (PBT), Polyphenylene sulfide (PPS), Polyamide (PA), poly ether-ether-ketone (PEEK), or polyaryletheretherketone (PAEK).

The groove 3313 includes a combination layer 334 therein, which is formed to the non-conductive portion 333 by injection molding. Therefore, the combination layer 334 firmly combines the metal pieces 3315, the non-conductive portion 333, and the base portion 3316. The combination layer 334 includes a plurality of rib portions 3342 for engaging to the nano holes 3319 of the internal surface 33154, 33164 to strengthen the connection of the metal pieces 3315 and the base portion 3316.

The connecting layer 335 is formed on the first surface 336 of the base body 331 for securing the frame 33, the cover 31 and some internal components (not shown). The connecting layer 335 includes a plurality of rib sections 3352 for engaging to nano holes 3319 of the internal surface 33164 of the base portion 3316. The connecting layer 335 can be made of plastic material, such as Polycarbonate (PC) or a mixture of Polycarbonate and Acrylonitrile butadiene Styrene copolymers (PC+ABS).

The second surface 337 of the base body 337 may further form a protection layer formed by Physical Vapor Deposition (PVD) technology.

The casing 30 is assembled to the main body 10, the metal pieces 3315 and the non-conductive portion 333 are corresponding to the antenna 50. The base body 331 may be coupled to the antenna 50 to be an extra part of the antenna 50, therefore, signals transmitted and received by the antenna 50 can pass through the non-conductive portion 333 to increase a radiating efficiency of the antenna 50.

In other embodiments, the base body 331 may not be coupled to the antenna 50 and not to be the extra part of the antenna 50, but signals transmitted and received by the antenna 50 can also pass through the non-conductive portion 333 to increase a radiating efficiency of the antenna 50.

A method for manufacturing the casing is described as follows:

Providing a base body 331 and a cover 31, the base body 331 has a rectangular frame shape and two first sidewalls 3311 and two second sidewalls 3312 connected in turn. The base body 331 can be made of metal material, such as aluminium, aluminium alloy, or stainless steel. When the base body 331 is made of aluminium or aluminium alloy, the aluminium or aluminium alloy metal can be pressed to the rectangular frame shape and then be incised. When the base body 331 is made of stainless steel, base body 331 can be formed by Computer Number Control (CNC) technology. The base body 331 has a thickness of about 10 millimeter.

Thinning a portion of the base body 331. Thinning opposite ends of the first sidewall 3311 or the second sidewall 3312 to form at least one groove 3313 and a thin portion 3310 corresponding to the groove 3313. In one embodiment, each first sidewall 3311 symmetrically forms two grooves 3313 on opposite ends.

Incising the thin portion 3310 to form a plurality of gaps 3314 throughout the portion 3310. The gaps 3314 devide the base body 331 into a plurality of metal pieces 3315 and base portions 3316. The base portions 3316 and the metal pieces 3315, every two metal pieces 3315 are spaced by the gaps 3314. A width of the gap 3314 is about 0.03-0.15 millimeter and a width of the metal piece 3315 is about 0.5-0.8 millimeter. Each metal piece 3315 includes a side surface 33152 and an internal surface 33154; each base portions 3316 includes a side surface 33162 and an internal surface 33164.

Forming a plurality of nano holes 3319 on the side surface 33152, 33162 and the internal surface 33154, 33164. Concretely, processing the base body 331 with Nano Mold Technology (NMT) or Electrochemical Insert Molding (ECIM) to form the nano holes 3319 with a diameter of about 40-60 nanometer.

Filling plastic material into the gaps 3314. Concretely, Filling plastic material into the gaps 3314 by insert molding technology to form the non-conductive portion between the metal pieces 3315 and the base portion 3316. In addition, the plastic material is inserted to the nano holes 3319 of the side surface 33152, 33162 to form a plurality of ribs 3332. The plastic material is inserted to the groove 3313 to form a combination layer 334 combining the internal surface 33154, 33164 and an end of the non-conductive portion 333.

Forming a connecting layer 335 on the internal surface 33164 and a surface of the combination surface 334. Concretely, filling plastic material to the internal surface 33164 and a surface of the combination surface 334 by secondary insert molding. Forming a plurality of rib sections 3352 by filling plastic material to the nano holes 3319 of the internal surface 33164. Hence, the frame 33 is accomplished.

Processing surface treatment to the frame 33 for better appearance effect. Forming a protection layer on the second surface 337 of the frame 33. Using anodicoxidation treatment when the base body 331 is made of aluminium or aluminium alloy; using physical vapor deposition (PVD) treatment when the base body 331 is made of stainless steel.

Removing extra material from the base body 331. Concretely, removing ends of the metal pieces 3315 and the base portion 3316 via computer number control technology to make the metal pieces 3315 and the base portion 3316 independent to each other to avoid affecting the signals of the antenna 50.

Forming several latching pieces (not shown) on the connecting layer 335 for engaging to the cover 31. Hence, the casing 30 is accomplished.

The electronic device 100 includes the frame 33 defining a plurality of grooves 3313 on the base body 331. The base body 331 has thin portion 3310 and defines a plurality of gaps 3314. The electronic device 100 further includes non-conductive portion 333 formed in the gaps 3314, render the signals transmitted and received by the antenna 50 can pass through the non-conductive portion 333 to increase a radiating efficiency of the antenna 50. In addition, the frame 33 has a smooth appearance since the tiny width of the gaps 3314.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A casing comprising:
   a cover; and
   a frame coupled to the cover and comprising:
   a base body defining a plurality of gaps spaced from each other, each gap having opposite sides; and
   a plurality of non-conductive portions correspondingly inserted into the gaps to insulate the opposite sides of each gap;
   wherein the base body defines a groove corresponding to the gaps and comprises a thin portion corresponding to the groove, the gaps are defined through the thin portion.

2. The casing as claimed in claim 1, wherein the base body comprises a first surface and a second surface opposite to the first surface, the groove is defined in the first surface or the second surface.

3. The casing as claimed in claim 2, wherein a thickness of the thin portion is 0.3-0.5 millimeter.

4. The casing as claimed in claim 1, wherein the gaps divide the base body into a plurality of metal pieces and base portions, the metal pieces and base portions adjacent to the metal pieces are connected via the non-conductive portions.

5. The casing as claimed in claim 4, wherein a width of each gap and each non-conductive portion is 0.03-0.15 millimeter.

6. The casing as claimed in claim 4, wherein each metal piece and each base portion define a plurality of nano holes on a surface connected to the non-conductive portion, each non-conductive portion comprises a plurality of ribs configured to engage to the nano holes of the metal piece and the base portion.

7. The casing as claimed in claim 6, wherein a diameter of the nano holes is 40-60 nanometer.

8. The casing as claimed in claim 6, wherein the frame further comprises a combination layer configured to couple the metal pieces, the base portions, and the non-conductive portions together.

9. The casing as claimed in claim 8, wherein the each metal piece and each base portion define a plurality of nano holes on a surface connected to the combination layer, the combination layer comprises a plurality of ribs portions configured to engage to the nano holes of the metal piece and the base portion.

10. The casing as claimed in claim 9, wherein the frame further comprises a connecting layer configured to couple the combination layer to the base portions; each base portion define a plurality of nano holes on a surface connected to the connecting layer, the connecting layer comprises a plurality of ribs sections configured to engage to the nano holes of the base portion.

11. An electronic device comprising:
a main body;
a frame comprising:
a base body defining a plurality of gaps spaced from each other, each gap having opposite sides;
wherein the base body defines a groove corresponding to the gaps and comprises a thin portion corresponding to the groove, the gaps are defined through the thin portion; and
a plurality of non-conductive portions correspondingly inserted into the gaps to insulate the opposite sides of each gap;
a cover coupling the frame to the main body; and
an antenna corresponding to the non-conductive portions.

12. The electronic device as claimed in claim 11, wherein the base body is coupled to the antenna to be an extra part of the antenna, signals transmitted and received by the antenna pass through the non-conductive portion.

13. The electronic device as claimed in claim 11, wherein the gaps divide the base body into a plurality of metal pieces and base portions, the metal pieces and base portions adjacent to the metal pieces are connected via the non-conductive portions.

* * * * *